US011373964B2

(12) United States Patent
Kiyota et al.

(10) Patent No.: US 11,373,964 B2
(45) Date of Patent: Jun. 28, 2022

(54) SEMICONDUCTOR CHIP (71) Applicant: SONY SEMICONDUCTOR SOLUTIONS CORPORATION, Kanagawa (JP)

(72) Inventors: Yuji Kiyota, Kanagawa (JP); Takahiro Takeda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/477,320

(22) PCT Filed: Jan. 17, 2018

(86) PCT No.: PCT/JP2018/001086
§ 371 (c)(1),
(2) Date: Jul. 11, 2019

(87) PCT Pub. No.: WO2018/139277
PCT Pub. Date: Aug. 2, 2018

(65) Prior Publication Data
US 2019/0371748 A1    Dec. 5, 2019

(30) Foreign Application Priority Data

Jan. 30, 2017 (JP) .............................. JP2017-014301

(51) Int. Cl.
*H01L 23/66* (2006.01)
*H01L 23/58* (2006.01)
(Continued)

(52) U.S. Cl.
CPC ............ *H01L 23/66* (2013.01); *H01L 23/585* (2013.01); *H01L 23/60* (2013.01); *H01L 24/06* (2013.01);
(Continued)

(58) Field of Classification Search
CPC ......... H01L 23/26; H01L 23/66; H01L 23/60; H01L 27/0248; H01L 29/408; H01L 2224/8011; H01L 2224/8211
See application file for complete search history.

(56) References Cited

U.S. PATENT DOCUMENTS 5,185,650 A * 2/1993 Wakimoto .......... H01L 23/5222
257/664
2003/0160322 A1   8/2003 Hsieh et al.
(Continued)

FOREIGN PATENT DOCUMENTS

CN          1607664 A       4/2005
DE          4006282 A1      8/1990
(Continued)

OTHER PUBLICATIONS

International Search Report and Written Opinion of PCT Application No. PCT/JP2018/001086, dated Feb. 27, 2018, 09 pages of ISRWO.

*Primary Examiner* — Marcos D. Pizarro
*Assistant Examiner* — Quinton Abrasfield
(74) *Attorney, Agent, or Firm* — Chip Law Group (57) ABSTRACT

The present technology relates to a semiconductor chip that can ensure a low impedance current path in an I/O ring while suppressing attenuation of radio frequency signals. The semiconductor chip includes an I/O ring surrounding a core circuit, first and second pads serving as input/output terminals for radio frequency signals, and a radio frequency signal transmission line electrically connected to the first and second pads and the core circuit. The radio frequency signal transmission line is formed above the I/O ring. The present technology is applicable to a semiconductor chip that performs input and output of RF signals.

11 Claims, 12 Drawing Sheets

(51) Int. Cl.
  *H01L 23/60*   (2006.01)
  *H01L 23/00*   (2006.01)
(52) U.S. Cl.
  CPC .............. *H01L 2223/6627* (2013.01); *H01L 2924/19032* (2013.01); *H01L 2924/19033* (2013.01)

(56) References Cited

U.S. PATENT DOCUMENTS

| | | |
|---|---|---|
| 2005/0045955 A1 | 3/2005 | Kim et al. |
| 2005/0067616 A1* | 3/2005 | Lien ................. H01L 22/34 257/48 |
| 2005/0160389 A1* | 7/2005 | Arai ................. H01L 23/585 716/120 |
| 2008/0042206 A1 | 2/2008 | Kim et al. |
| 2009/0303645 A1* | 12/2009 | Sasaki ................. H01L 23/60 361/56 |
| 2011/0242712 A1* | 10/2011 | Huang ................. H01L 27/0296 361/56 |
| 2012/0140366 A1 | 6/2012 | Sasaki |
| 2013/0155555 A1* | 6/2013 | Blanc ................. H01L 23/522 257/659 |
| 2014/0334512 A1* | 11/2014 | Kwon ................. H01S 5/12 372/45.01 |
| 2015/0145098 A1* | 5/2015 | Ma ................. H01L 23/60 257/491 |

FOREIGN PATENT DOCUMENTS

| | | |
|---|---|---|
| DE | 102004041831 A1 | 3/2005 |
| JP | 02-226756 A | 9/1990 |
| JP | 10-321804 A | 12/1998 |
| JP | 2003-258152 A | 9/2003 |
| JP | 2003-347407 A | 12/2003 |
| JP | 2005-072607 A | 3/2005 |
| JP | 2009-176535 A | 8/2009 |
| JP | 2009-295855 A | 12/2009 |
| JP | 2014-096521 A | 5/2014 |
| JP | 2014-160750 A | 9/2014 |
| KR | 10-2005-0022879 A | 3/2005 |
| TW | 531866 B | 5/2003 |
| TW | 200509363 A | 3/2005 |

\* cited by examiner

SEMICONDUCTOR CHIP

CROSS REFERENCE TO RELATED APPLICATIONS

This application is a U.S. National Phase of International Patent Application No. PCT/JP2018/001086 filed on Jan. 17, 2018, which claims priority benefit of Japanese Patent Application No. JP 2017-014301 filed in the Japan Patent Office on Jan. 30, 2017. Each of the above-referenced applications is hereby incorporated herein by reference in its entirety.

TECHNICAL FIELD

The present technology relates to a semiconductor chip, and more particularly to a semiconductor chip that can assure a low impedance current path in an I/O ring.

BACKGROUND ART

Conventionally, there is a known semiconductor chip having an input/output terminal on chip outer periphery as an interface (I/F) for exchanging signals between the inside and the outside of the chip. The input/output terminal internally includes an I/O ring having an Electro Static Discharge (ESD) protection circuit providing protection against electrostatic discharge. Inside the I/O ring, there are arranged core circuits having various processing functions. With the presence of this I/O ring, it is possible to ensure a low impedance current path as a path of the ESD current to avoid breakage of elements included in the core circuit even in a case where a high voltage is applied across the terminals.

For example, Patent Document 1 describes a semiconductor chip having a configuration that allows a surge current to be diverted from one processing circuit so as to be discharged to the ground via a ground pad of another processing circuit.

Meanwhile, it is necessary, on an input/output terminal of a radio frequency signal (Radio Frequency (RF) I/O) such as a millimeter wave, to suppress attenuation of the radio frequency signal due to the discontinuity of impedance. Examples of transmission lines widely used to suppress attenuation of radio frequency signals include transmission lines such as microstrip lines.

CITATION LIST

Patent Document

Patent Document 1: Japanese Patent Application Laid-Open No. 2014-96521

SUMMARY OF THE INVENTION

Problems to be Solved by the Invention

However, in the case of forming a transmission line for suppressing attenuation of radio frequency signals in a semiconductor chip including an I/O ring, it has been necessary to cut a part of the wiring of the I/O ring. In this case, the impedance of the path of the ESD current might be increased depending on the arrangement of the terminals to which the high voltage is applied.

The present technology has been made in view of such a situation, and aims to be able to ensure a low impedance current path in an I/O ring while suppressing attenuation of the radio frequency signals.

Solutions to Problems

A semiconductor chip according to the present technology includes: an I/O ring surrounding a core circuit; first and second pads serving as input/output terminals for radio frequency signals; and a radio frequency signal transmission line electrically connected to the first and second pads and the core circuit, in which the radio frequency signal transmission line is formed above the I/O ring.

The radio frequency signal transmission line may be a microstrip line including: a signal line electrically connected to the first pad and the core circuit; and a first ground plane electrically connected to the second pad and the core circuit.

The first ground plane may be formed above the I/O ring and below the signal line.

The radio frequency signal transmission line may extend along the signal line on both sides or one side of the signal line at a position at least above the first ground plane, and may further include a second ground plane electrically connected to the first ground plane.

The first and second pads may constitute a ground-signal-ground (GSG) pad.

The first and second pads may constitute a ground-signal-signal-ground (GSSG) pad.

The first and second pads may constitute a ground-signal (GS) pad.

The first ground plane may be formed to extend immediately below the first and second pads.

The radio frequency signal transmission line may be a coplanar waveguide including: a signal line electrically connected to the first pad and the core circuit; and a ground plane electrically connected to the second pad and the core circuit.

The signal line and the ground line may be formed above the I/O ring and may be formed on an identical plane.

The first and second pads may constitute a ground-signal-ground (GSG) pad.

The core circuit may include an Electro-Static Discharge (ESD) protection circuit connected to the first pad and the I/O ring.

In the present technology, the radio frequency signal transmission line is electrically connected to the first and second pads serving as input/output terminals for radio frequency signals and to the core circuit surrounded by the I/O ring, and is formed above the I/O ring.

Effects of the Invention

According to the present technology, it is possible to ensure a low impedance current path in the I/O ring while suppressing attenuation of radio frequency signals. Note that effects described herein are necessarily non-restricting. The effects may be any of effects described in the present disclosure.

MODE FOR CARRYING OUT THE INVENTION

Hereinafter, preferred embodiments of the present technology will be described in detail with reference to the drawings. Note that same reference numerals are given to constituent elements having substantially a same functional configuration, and redundant description is omitted in the present specification and the drawings.

Furthermore, description will be presented in the following order.

1. Known technology and its problems
2. First Embodiment
3. Second Embodiment
4. Third Embodiment
5. Fourth Embodiment
6. Fifth Embodiment
7. Sixth Embodiment
8. Seventh Embodiment 1. Known Technology and its Problems FIG. 1 is a view illustrating a configuration example of a semiconductor chip including an I/O ring.

Figure 1:
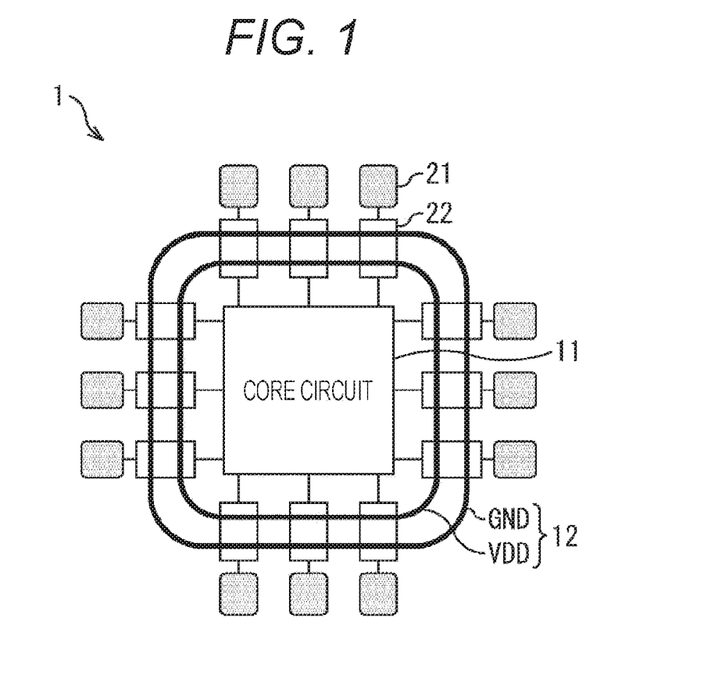
FIG. 1 is a view illustrating a configuration example of a semiconductor chip including an I/O ring.

A semiconductor chip 1 of FIG. 1 includes a core circuit 11 having various processing functions and an I/O ring 12. The I/O ring 12 includes a power supply wiring VDD and a ground wiring GND surrounding the core circuit 11.

On the outer periphery of the I/O ring 12, there is disposed a plurality of pads 21 being input/output terminals for exchanging signals between the core circuit 11 and the outside.

Furthermore, an ESD protection circuit 22 is provided between each of the pads 21 and the core circuit 11. The ESD protection circuit 22 is connected to each of the power supply wiring VDD and the ground wiring GND of the I/O ring 12.

In a case where a high voltage is applied between one pad 21 and another pad 21 in this semiconductor chip 1, an ESD current is discharged through the I/O ring 12 via the ESD protection circuit 22.

Figure 2:
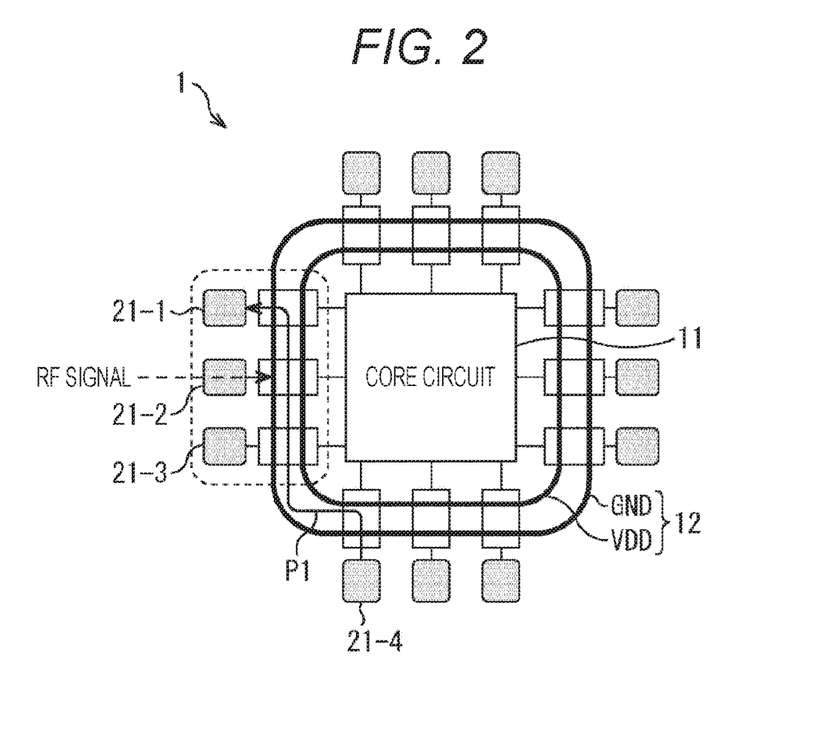
FIG. 2 is a view illustrating a first known example of a semiconductor chip.

For example, as illustrated in FIG. 2, in a case where a high voltage is applied between the pad 21-4 and the pad 21-1, the ESD current is discharged through the low impedance current path P1.

Here, in a case where the pads 21-1 to 21-3 are used as RF I/O constituting a ground-signal-ground (GSG) pad in FIG. 2, a radio frequency signal (RF signal) is input to the pad 21-2.

Figure 3:
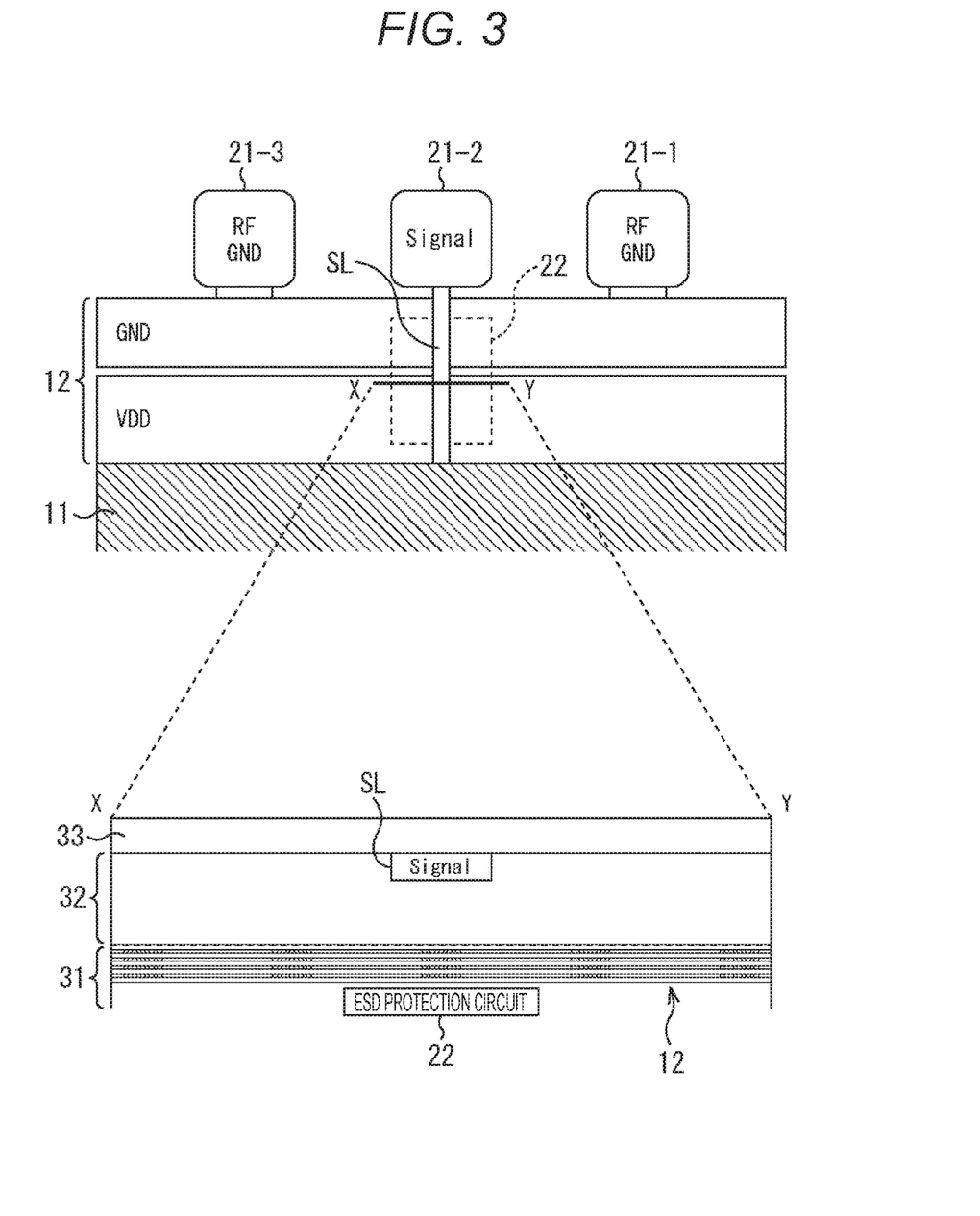
FIG. 3 is plan view and a cross-sectional view illustrating a configuration of portions in the vicinity of RF I/O.

FIG. 3 illustrates a configuration of portions in the vicinity of RF I/O surrounded by a broken line in FIG. 2. An upper part of FIG. 3 illustrates a plan view of a portion in the vicinity of the RF I/O. A lower part of FIG. 3 illustrates a cross-sectional view taken along line X-Y in the plan view of the upper part of FIG. 3.

As illustrated in the upper part of FIG. 3, the pad 21-2 to which the RF signal is input and the core circuit 11 are electrically connected to each other by a signal line SL.

Furthermore, as illustrated in the lower part of FIG. 3, the semiconductor chip 1 has a cross-sectional structure including a thin film wiring layer 31, a thick film wiring layer 32, and a passivation layer 33. The ESD protection circuit 22 is formed below the I/O ring 12 formed in the thin film wiring layer 31. Furthermore, the signal line SL is formed in the thick film wiring layer 32 above the thin film wiring layer 31. Note that the signal line SL and the ESD protection circuit 22 are electrically connected to each other, although not illustrated.

In a case where an RF signal is input to the pad 21-2 with this structure of the semiconductor chip 1, the RF signal would be greatly attenuated by the parasitic capacitance of the ESD protection circuit 22.

Figure 4:
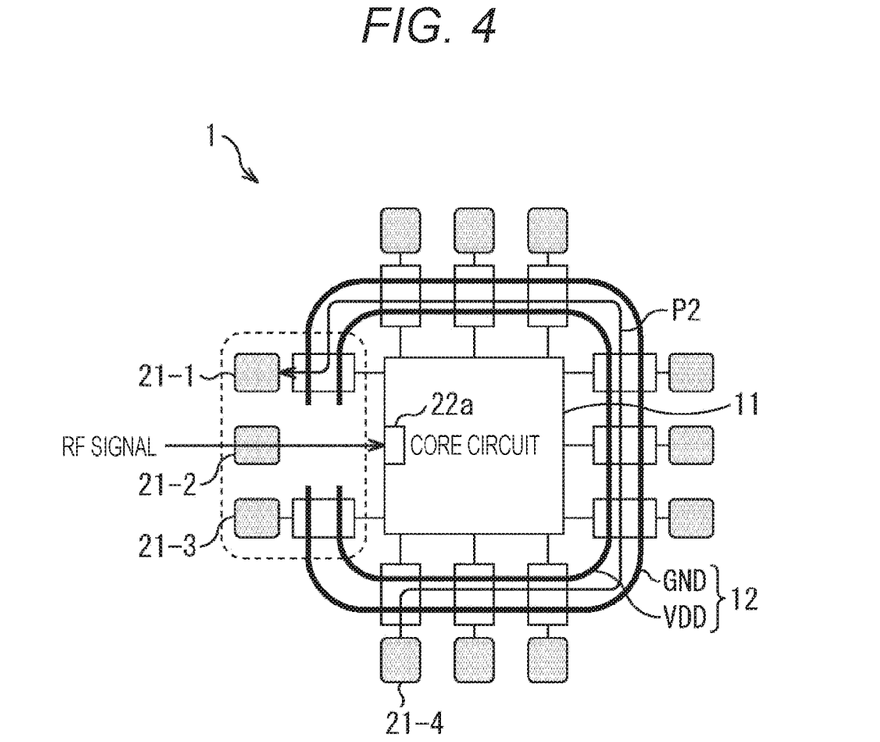
FIG. 4 is a view illustrating a second known example of a semiconductor chip.

To cope with this, as illustrated in FIG. 4, a part of the wiring of the I/O ring is cut to form an RF signal transmission line for suppressing the attenuation of the RF signal. In the example of FIG. 4, the core circuit 11 includes an ESD protection circuit 22a corresponding to the pad 21-2.

Figure 5:
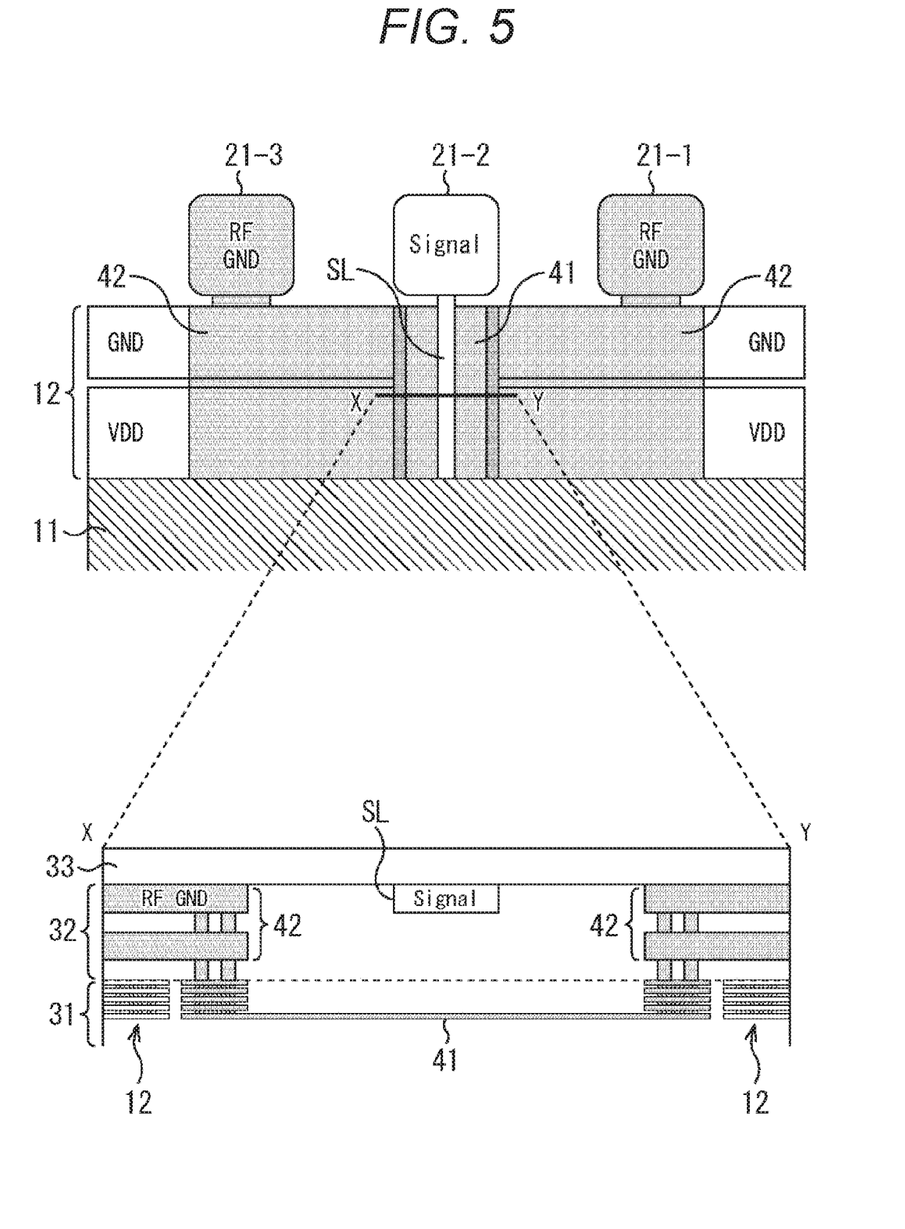
FIG. 5 is a plan view and a cross-sectional view illustrating a configuration of portions in the vicinity of RF I/O.

FIG. 5 illustrates a configuration of portions in the vicinity of RF I/O surrounded by a broken line in FIG. 4. An upper part of FIG. 5 illustrates a plan view of a portion in the vicinity of the RF I/O. A lower part of FIG. 5 illustrates a cross-sectional view taken along line X-Y in the plan view of the upper part of FIG. 5.

As illustrated in the upper part of FIG. 5, the pad 21-2 to which an RF signal is input and the core circuit 11 are electrically connected by the signal line SL.

Furthermore, as illustrated in the lower part of FIG. 5, a ground plane 41 is provided in the thin film wiring layer 31 below the thick film wiring layer 32 in which the signal line SL is formed. The ground plane 41 is formed in the thin film wiring layer 31 in a region where the wiring of the I/O ring 12 is cut. The ground plane 41 is electrically connected to the core circuit 11, while being electrically connected to the pads 21-1 and 21-3 via a ground plane 42 provided in the thick film wiring layer 32.

That is, in the example of FIG. 5, the signal line SL and the ground plane 41 constitute a microstrip line as an RF signal transmission line.

With such a structure, attenuation of the RF signal can be suppressed even in a case where the RF signal is input to the pad 21-2.

However, because a part of the wiring of the I/O ring 12 is cut, in a case where a high voltage is applied between pad 21-4 and pad 21-1 as illustrated in FIG. 4, the ESD current is discharged through a high impedance current path P2, as a path.

To handle this, the following will describe a configuration for ensuring a low impedance current path in the I/O ring while suppressing attenuation of the RF signals.

2. First Embodiment

Figure 6:
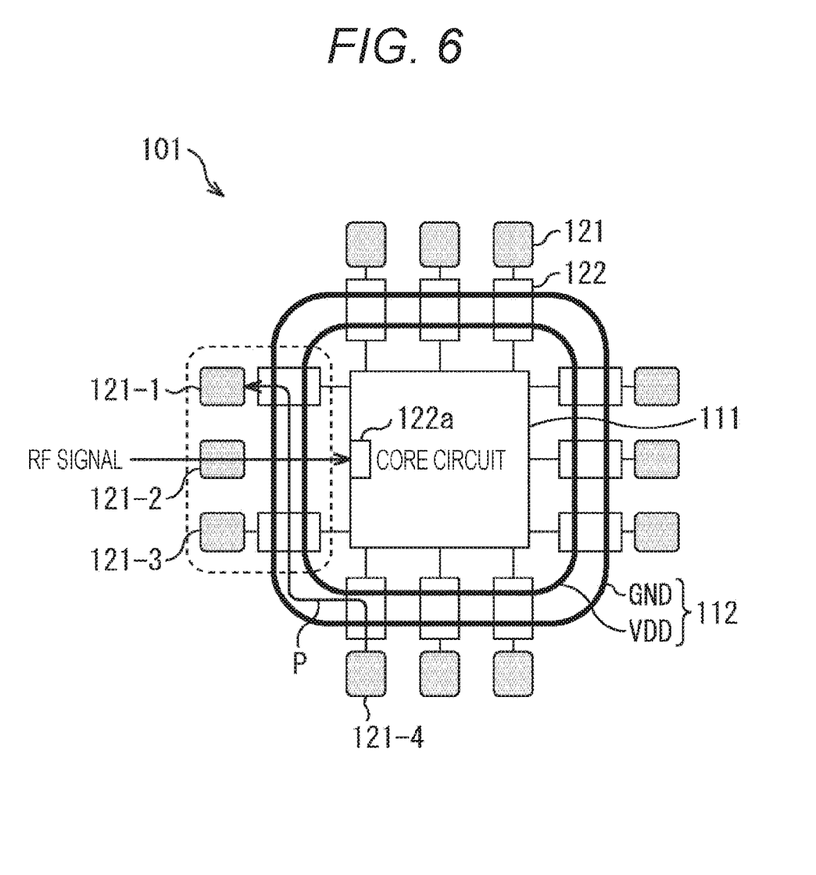
FIG. 6 is a view illustrating a configuration example of a semiconductor chip to which the present technology is applied.

FIG. 6 illustrates a configuration example of the semiconductor chip of a first embodiment to which the present technology is applied.

A semiconductor chip 101 of FIG. 6 includes: a core circuit 111 having various processing functions; and an I/O ring 112, which are formed on a semiconductor substrate such as a Si substrate. The I/O ring 112 includes a power supply wiring VDD and a ground wiring GND surrounding the core circuit 111.

On the outer periphery of the I/O ring 112, there is disposed a plurality of pads 121 being input/output terminals for exchanging signals between the core circuit 111 and the outside.

Furthermore, an ESD protection circuit 122 is provided between each of the pads 121 and the core circuit 111. The ESD protection circuit 122 includes, for example, a Gate Grounded MOS (GGMOS) transistor, or the like, and is connected to each of the power supply wiring VDD and the ground wiring GND of the I/O ring 112. Note that the core circuit 111 includes the ESD protection circuit 122a that corresponds to the pad 121-2 in the example of FIG. 6. The ESD protection circuit 122a includes an inductor for a high frequency circuit or the like and is connected to the pad 121-2 and the I/O ring 112.

In FIG. 6, pads 121-1 to 121-3 are used as RF I/O constituting a GSG pad, and an RF signal is input to the pad 121-2.

Figure 7:
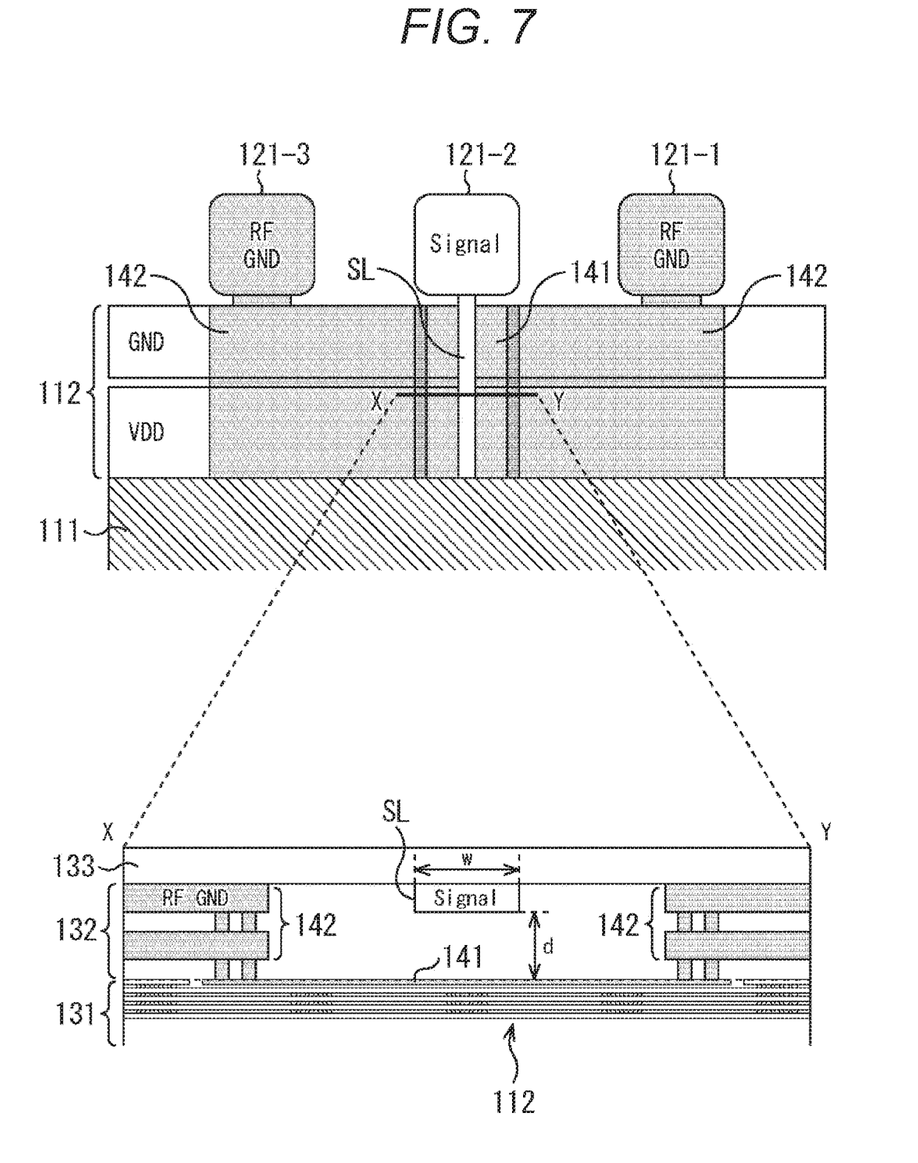
FIG. 7 is a plan view and a cross-sectional view illustrating a configuration of portions in the vicinity of RF I/O.

FIG. 7 illustrates a configuration of portions in the vicinity of RF I/O surrounded by a broken line in FIG. 6. An upper part of FIG. 7 illustrates a plan view of a portion in the vicinity of the RF I/O. A lower part of FIG. 7 illustrates a cross-sectional view taken along line X-Y in the plan view of the upper part of FIG. 7.

As illustrated in the upper part of FIG. 7, the pad 121-2 to which the RF signal is input and the core circuit 111 are electrically connected with each other by the signal line SL.

Furthermore, as illustrated in the lower part of FIG. 7, the semiconductor chip 101 has a cross-sectional structure including a thin film wiring layer 131, a thick film wiring layer 132, and a passivation layer 133.

An I/O ring 112 is formed in the thin film wiring layer 131. In the example of FIG. 7, the I/O ring 112 includes a wiring layer formed with five layers. Furthermore, in the thin film wiring layer 131, a ground plane 141 including a metal such as Cu is provided above the I/O ring 112. Specifically, the thin film wiring layer 131 below signal line SL includes the ground plane 141 formed as a part of the uppermost wiring layer of the five wiring layers constituting I/O ring 112. In other words, the ground plane 141 is formed above four layers out of the five wiring layers constituting the I/O ring 112.

Furthermore, the ground plane 141 is electrically connected to the core circuit 111, while being electrically connected to the pads 121-1 and 121-3 via a ground plane 142 provided in the thick film wiring layer 132. The ground plane 142 including a metal such as Cu has a two-layer structure, extending along both sides of the signal line SL. This results in formation of return paths between the pad 121-2 and the pad 121-1 and between the pad 121-2 and the pad 121-3, individually.

In this manner, in the example of FIG. 7, the signal line SL and the ground plane 141 form a microstrip line as an RF signal transmission line connected to the GSG pad and the core circuit 111.

According to the above structure, it is possible to implement the RF I/O without cutting a part of the wiring of the I/O ring 112. Therefore, as illustrated in FIG. 6, in a case where a high voltage is applied between the pad 121-4 and the pad 121-1, the ESD current can be discharged through the low impedance current path P. This makes it possible to ensure a current path of low impedance in the I/O ring while suppressing attenuation of radio frequency signals.

Characteristic impedance of the microstrip line configured as described above is appropriately designed to achieve matching with the impedance of an external circuit connected to the pad 121-2.

At this time, the larger a distance d between the signal line SL and the ground plane 141, the thicker a wiring width w of the signal line SL can be. However, the smaller the distance d between the signal line SL and the ground plane 141, the thinner the wiring width w of the signal line SL need to be. In the former case, there is a need to form the wiring layer of the I/O ring 112 to be thin, leading to an increase in the electrical resistance of the I/O ring 112, while the transmission loss of the RF signal can be reduced. In contrast, in the latter case, the transmission loss of the RF signal increases. However, the wiring layer of the I/O ring 112 can be thickened, making it possible to reduce the electrical resistance of the I/O ring 112.

In this manner, there is a trade-off between the distance d between the signal line SL and the ground plane 141, and the wiring width w of the signal line SL.

Note that the ground planes 141 and 142 are separated from the ground wiring GND of the I/O ring 112 in the configuration of the present embodiment. This can ensure isolation from other power supply wiring.

3. Second Embodiment

Figure 8:
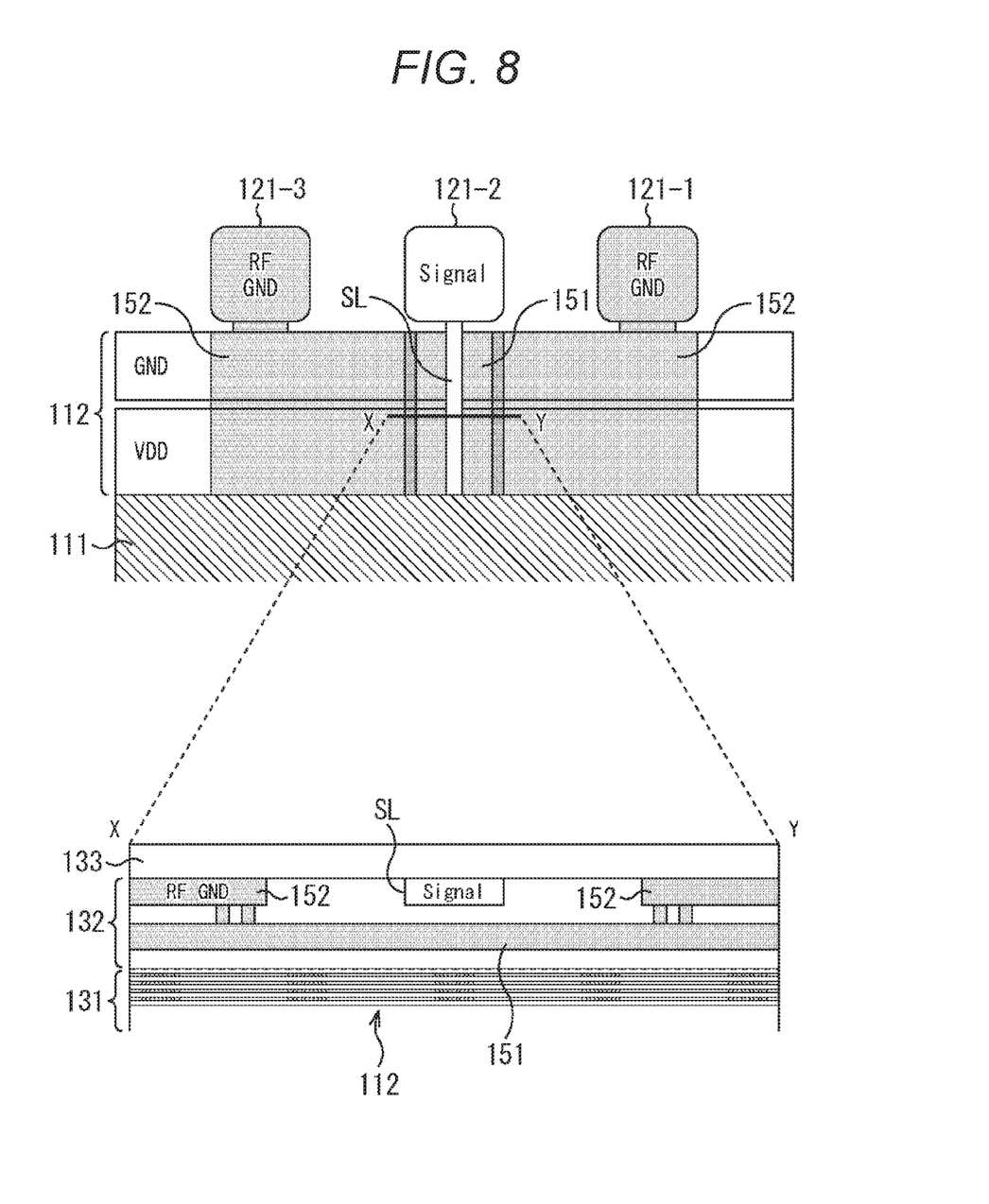
FIG. 8 is a plan view and a cross-sectional view illustrating a configuration of portions in the vicinity of RF I/O.

FIG. 8 illustrates a configuration of portions in the vicinity of RF I/O in a semiconductor chip according to a second embodiment.

In the example of FIG. 8, the I/O ring 112 including five wiring layers is simply formed in the thin film wiring layer 131, and the ground plane 151 is provided in the thick film wiring layer 132.

Furthermore, the ground plane 151 is electrically connected to the core circuit 111, while being electrically connected to the pads 121-1 and 121-3 via the ground plane 152 provided above the ground plane 151 in the thick film wiring layer 132. The ground plane 152 having a single-layer structure is formed to extend along the signal line SL on both sides.

In this manner, in the example of FIG. 8, the signal line SL and the ground plane 151 form a microstrip line as an RF signal transmission line connected to the GSG pad and the core circuit 111.

With the design that optimizes the distance d between the signal line SL and the ground plane 151 and optimizes the wiring width w of the signal line SL, it would be possible to form the ground plane of the microstrip line simply in the thick film wiring layer 32 above the I/O ring 112, as in the present embodiment.

4. Third Embodiment

Figure 9:
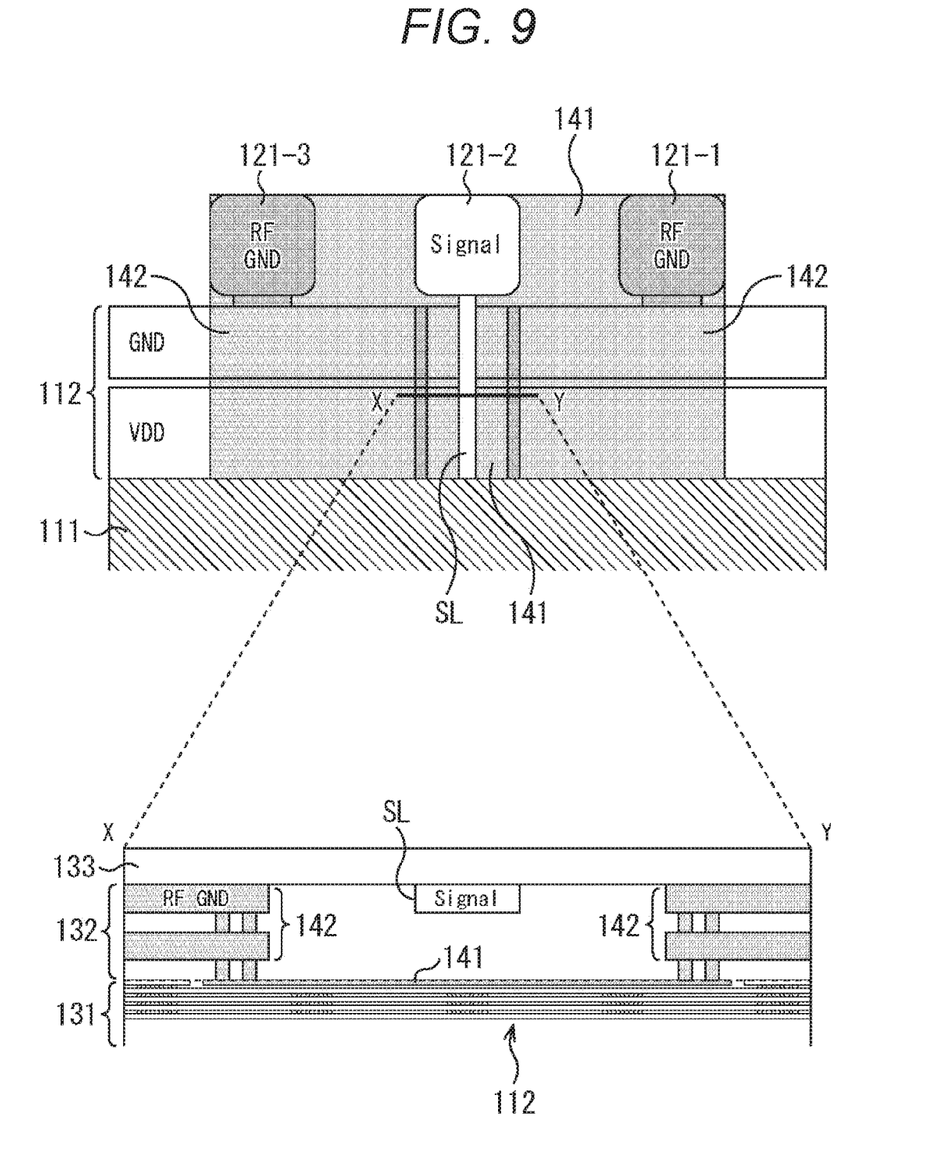
FIG. 9 is a plan view and a cross-sectional view illustrating a configuration of portions in the vicinity of RF I/O.

FIG. 9 illustrates a configuration of portions in the vicinity of RF I/O in a semiconductor chip according to a third embodiment.

In the example of FIG. 9, the ground plane 141 of the thin film wiring layer 131 is formed to extend to immediately below the pad 121-2 to which an RF signal is input, and further to immediately below the pads 121-1 and 121-3.

In a case where the Si layer is located immediately below the pad to be the RF I/O, simulation accuracy in electromagnetic field analysis at the design stage or the like might be deteriorated. As opposed to this, the accuracy of these types of analyses can be improved by using a metal layer immediately below the pad to be the RF I/O.

5. Fourth Embodiment

Figure 10:
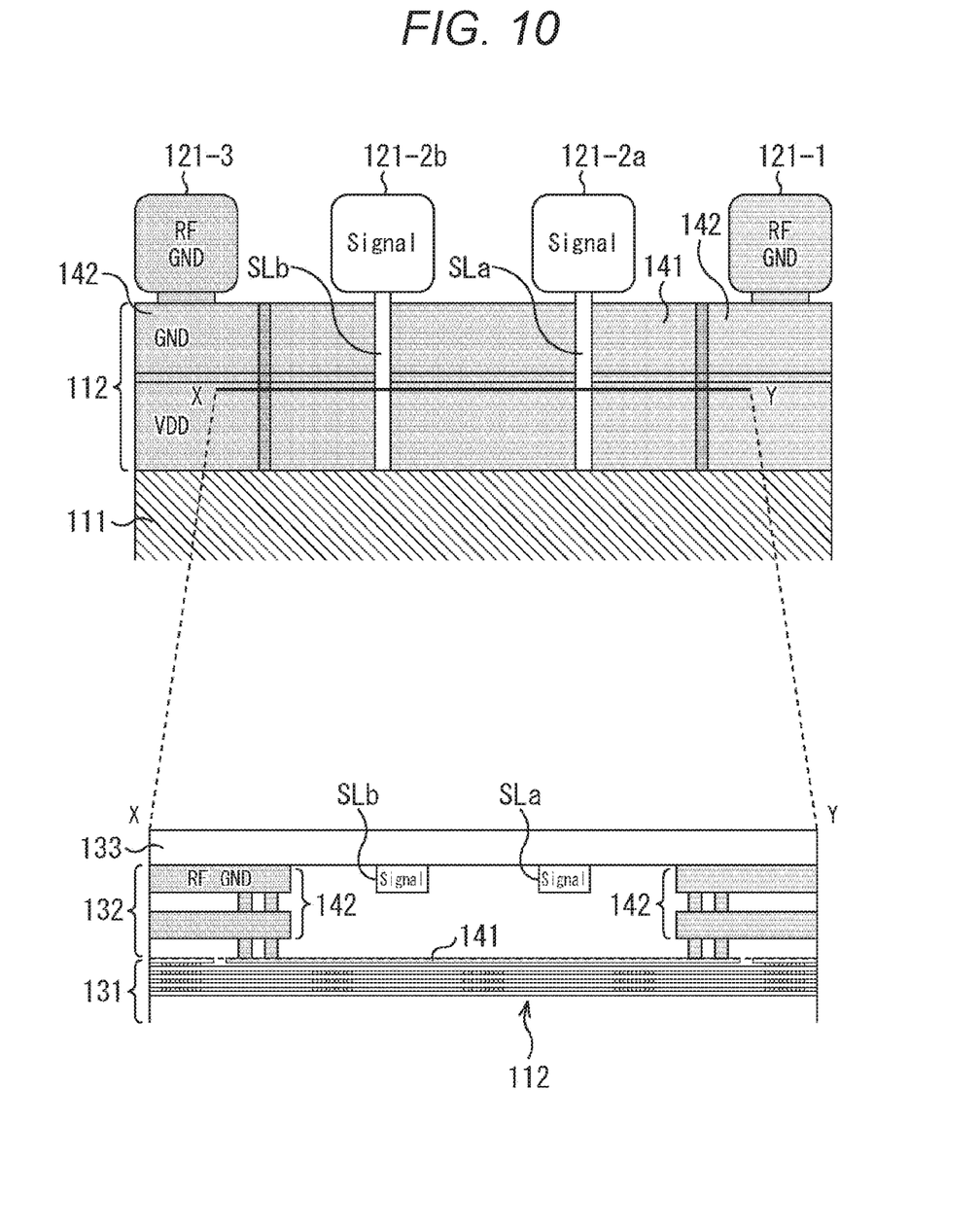
FIG. 10 is a plan view and a cross-sectional view illustrating the configuration of portions in the vicinity of RF I/O.

FIG. 10 illustrates a configuration of portions in the vicinity of RF I/O in a semiconductor chip according to a fourth embodiment.

In the example of FIG. 10, two pads 121-2a and 121-2b are provided as pads to which an RF signal is input. The pad 121-2a and the core circuit 111 are electrically connected by a signal line SLa. The pad 121-2b and the core circuit 111 are electrically connected by a signal line SLb.

That is, in FIG. 10, the pads 121-1 121-2a 121-2b, and 121-3 are used as RF I/O constituting a ground-signal-signal-ground (GSSG) pad.

With this configuration, it is possible to input a differential RF signal to the core circuit 111.

6. Fifth Embodiment

Figure 11:
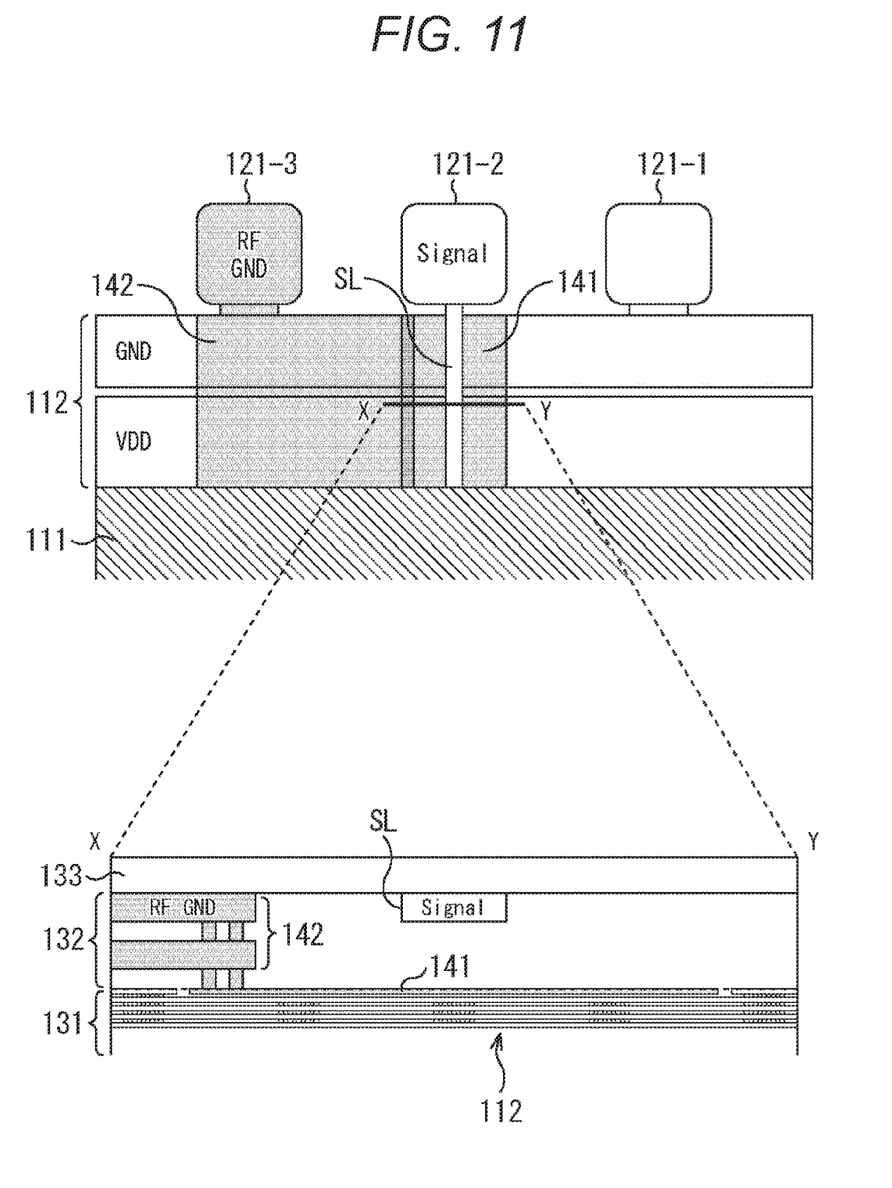
FIG. 11 is a plan view and a cross-sectional view illustrating a configuration of portions in the vicinity of RF I/O.

FIG. 11 illustrates a configuration of portions in the vicinity of RF I/O in a semiconductor chip according to a fifth embodiment.

In the example of FIG. 11, the ground plane 142 connected to the pad 121-3 is formed in the thick film wiring layer 132 so as to extend along one side of the signal line SL. In FIG. 11, pads 121-2 and 121-3 are used as RF I/O constituting a Ground Signal (GS) pad, and a return path is formed simply between the pad 121-2 and the pad 121-3.

It is also possible to adopt the configuration as the present embodiment when it is possible to achieve matching of the characteristic impedance with the impedance of the external circuit.

7. Sixth Embodiment

Figure 12:
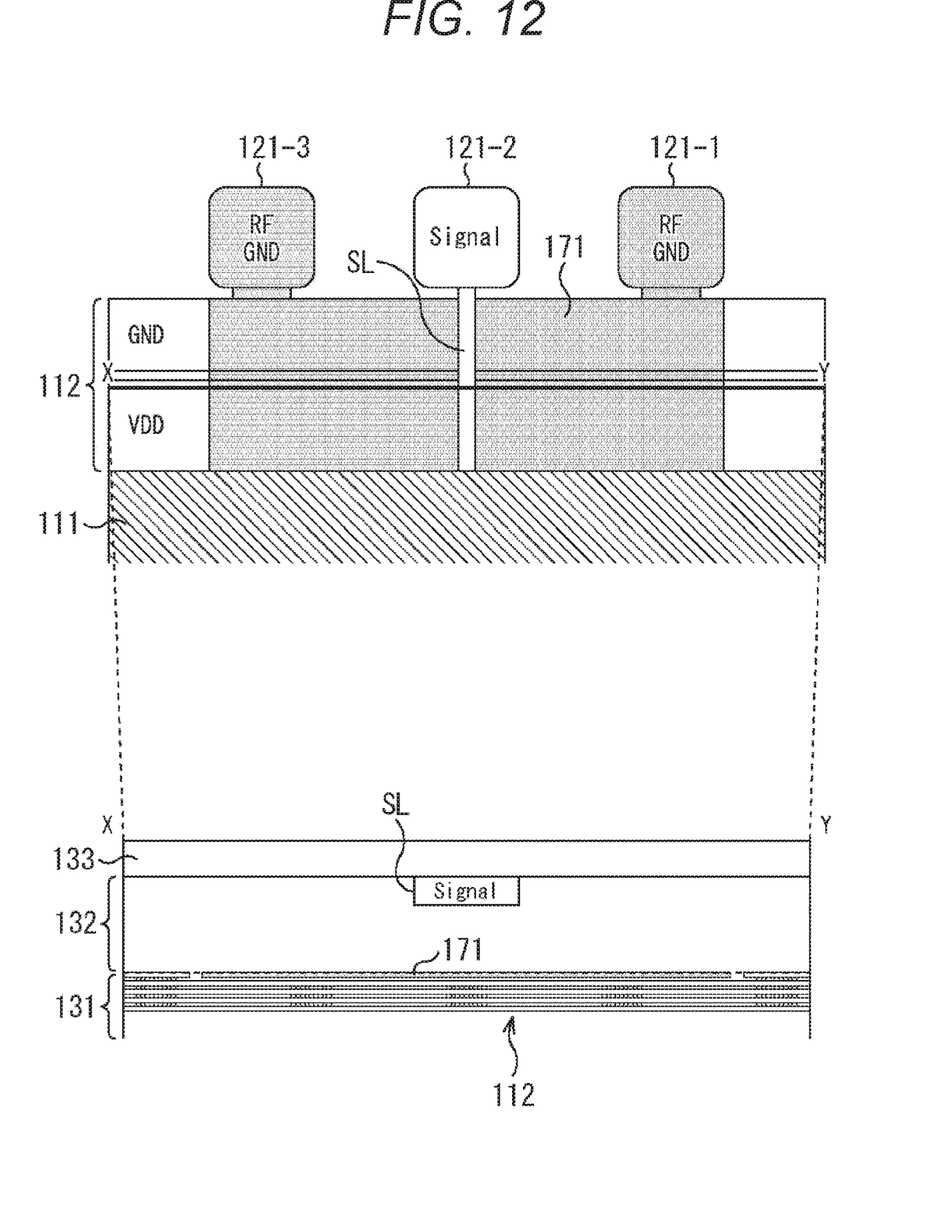
FIG. 12 is a plan view and a cross-sectional view illustrating a configuration of portions in the vicinity of RF I/O.

FIG. 12 illustrates a configuration of portions in the vicinity of RF I/O in a semiconductor chip according to a sixth embodiment.

In the example of FIG. 12, the thin film wiring layer 131 below the signal line SL includes a ground plane 171 provided in a part of the layer above the I/O ring 112 (the uppermost layer of the five wiring layers). The thick film wiring layer 132 has no ground plane. The ground plane 171 is directly electrically connected to the core circuit 111 and the pads 121-1 and 121-3.

In the example of FIG. 12, the signal line SL and the ground plane 171 also constitute a microstrip line as an RF signal transmission line.

It is also possible to adopt the configuration as the present embodiment when it is possible to reduce the characteristic impedance.

8. Seventh Embodiment

Figure 13:
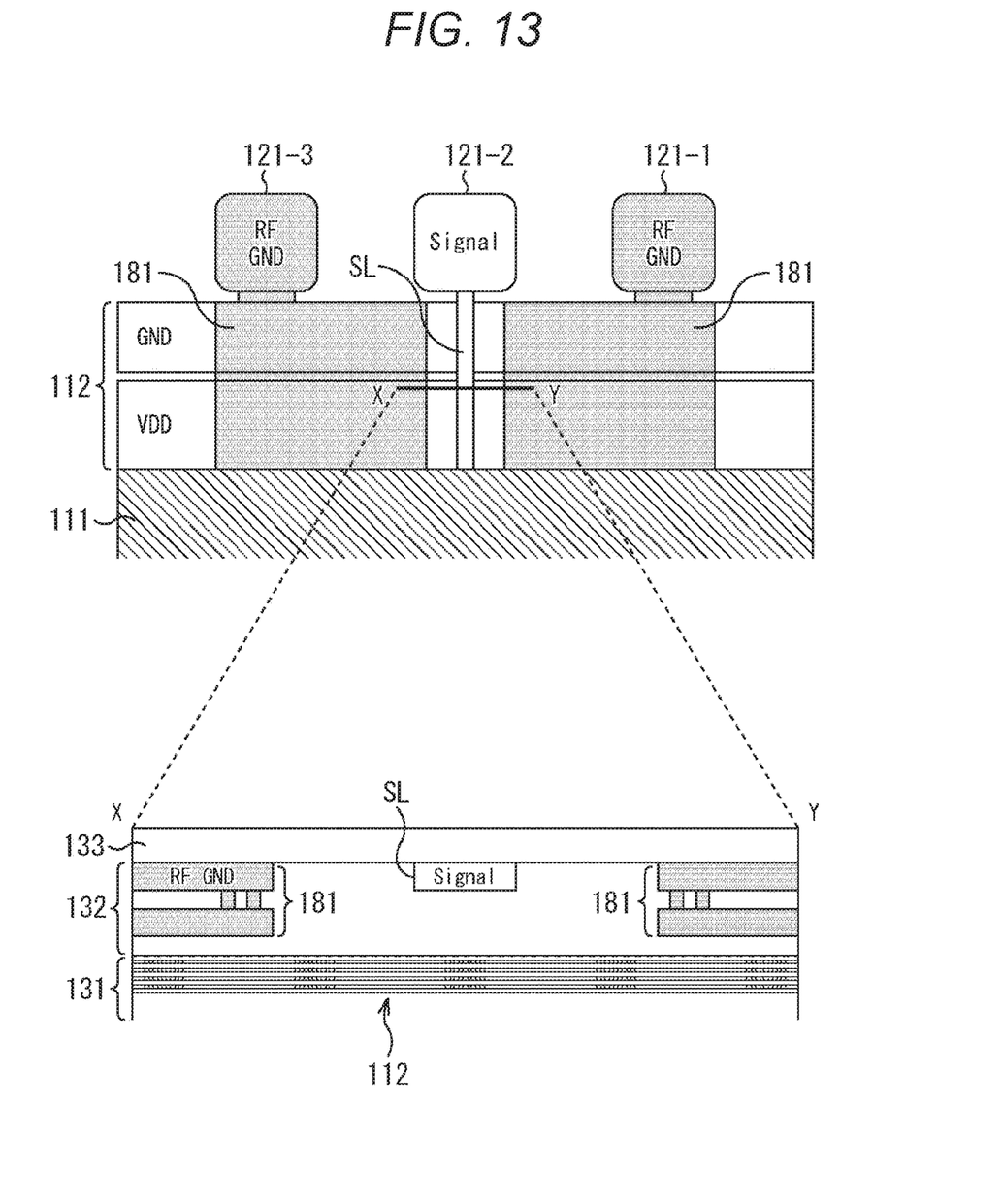
FIG. 13 is a plan view and a cross-sectional view illustrating a configuration of portions in the vicinity of RF I/O.

FIG. 13 illustrates a configuration of portions in the vicinity of RF I/O in a semiconductor chip according to a seventh embodiment.

In the example of FIG. 13, the I/O ring 112 alone is formed in the thin film wiring layer 131. In the thick film wiring layer 132, a ground plane 181 is provided on the same surface as the signal line SL. The ground plane 181 has a two-layer structure and is formed extending along signal line SL on both sides, and each of these is electrically connected to each of the core circuit 111 and pads 121-1 and 121-3, respectively.

That is, in the example of FIG. 13, the signal line SL and the ground plane 181 form a coplanar waveguide as an RF signal transmission line connected to the GSG pad and the core circuit 111.

In the configuration of the present embodiment, it is also possible to configure the RF I/O without cutting a part of the wiring of the I/O ring 112. Therefore, it is possible to ensure a current path of low impedance in the I/O ring while suppressing the attenuation of the radio frequency signal.

Note that the ESD protection circuit 122a corresponding to the pad to which the RF signal is input is assumed to be provided in the core circuit 111 in the embodiment described above. However, in the embodiment of the present technology, it would be sufficient as long as an RF signal transmission line such as a microstrip line or a coplanar waveguide be formed above the I/O ring 112. Accordingly, similarly to the configuration illustrated in FIG. 3, the ESD protection circuit 122a may be formed below the I/O ring 112.

Furthermore, the configurations of the above-described embodiments can be applied as a single configuration or in combination.

Furthermore, the embodiments of the present technology are not limited to the above-described embodiments but can be modified in a variety of ways within a scope of the present technology.

In addition, the present technology can be configured as follows.

(1)

A semiconductor chip including:

an I/O ring surrounding a core circuit;

first and second pads serving as input/output terminals for radio frequency signals; and a radio frequency signal transmission line electrically connected to the first and second pads and the core circuit, in which the radio frequency signal transmission line is formed above the I/O ring.

(2)

The semiconductor chip according to (1), in which the radio frequency signal transmission line is a microstrip line including:

a signal line electrically connected to the first pad and the core circuit; and a first ground plane electrically connected to the second pad and the core circuit.

(3)

The semiconductor chip according to (2), in which the first ground plane is formed above the I/O ring and below the signal line.

(4)

The semiconductor chip according to (2) or (3), in which the radio frequency signal transmission line extends along the signal line on both sides or one side of the signal line at a position at least above the first ground plane, and further includes a second ground plane electrically connected to the first ground plane.

(5)

The semiconductor chip according to any of (2) to (4), in which the first and second pads constitute a ground-signal-ground (GSG) pad.

(6)

The semiconductor chip according to any of (2) to (4), in which the first and second pads constitute a ground-signal-signal-ground (GSSG) pad.

(7)

The semiconductor chip according to any of (2) to (4), in which the first and second pads constitute a ground-signal (GS) pad.

(8) The semiconductor chip according to any of (2) to (7),
in which the first ground plane is formed to extend immediately below the first and second pads.

(9) The semiconductor chip according to (1),
in which the radio frequency signal transmission line is a coplanar waveguide including:
a signal line electrically connected to the first pad and the core circuit; and
a ground plane electrically connected to the second pad and the core circuit.

(10) The semiconductor chip according to (9),
in which the signal line and the ground line is formed above the I/O ring and formed on an identical plane.

(11) The semiconductor chip according to (9) or (10),
in which the first and second pads constitute a ground-signal-ground (GSG) pad.

(12) The semiconductor chip according to any of (1) to (11),
in which the core circuit includes an Electro-Static Discharge (ESD) protection circuit connected to the first pad and the I/O ring.

REFERENCE SIGNS LIST

101 Semiconductor chip
111 Core circuit
112 I/O ring
GND Ground wiring
VDD Power supply wiring
121 Pad
122 ESD protection circuit
131 Thin film wiring layer
132 Thick film wiring layer
133 Passivation layer
141, 142 Ground plane
SL Signal line

The invention claimed is:

1. A semiconductor chip, comprising:
a core circuit that includes a first Electro-Static Discharge (ESD) protection circuit;
an input/output (I/O) ring that surrounds the core circuit;
a thin film wiring layer that includes the I/O ring;
a passivation layer above the thin film wiring layer;
a first pad and a second pad, wherein
each of the first pad and the second pad is an input/output terminal for radio frequency signals, and
the first ESD protection circuit is connected to the first pad and the I/O ring;
a second ESD protection circuit between the second pad and the core circuit; and
a radio frequency signal transmission line electrically connected to the first pad, second pad, and the core circuit, wherein
the radio frequency signal transmission line includes a signal line, a first ground plane, and a second ground plane,
the second ground plane is above the first ground plane, and
the radio frequency signal transmission line is above the I/O ring.

2. The semiconductor chip according to claim 1, wherein
the radio frequency signal transmission line is a microstrip line,
the signal line is electrically connected to the first pad and the core circuit, and
the first ground plane is electrically connected to the second pad and the core circuit.

3. The semiconductor chip according to claim 2, wherein the first ground plane is below the signal line.

4. The semiconductor chip according to claim 3, wherein
the second ground plane extends along the signal line on one of both sides of the signal line or one side of the signal line, and
the second ground plane extends at a position above the first ground plane and is electrically connected to the first ground plane.

5. The semiconductor chip according to claim 2, wherein each of the first pad and the second pad comprises a ground-signal-ground (GSG) pad.

6. The semiconductor chip according to claim 2, wherein each of the first pad and the second pad comprises a ground-signal-signal-ground (GSSG) pad.

7. The semiconductor chip according to claim 2, wherein each of the first pad and the second pad comprises a ground-signal (GS) pad.

8. The semiconductor chip according to claim 2, wherein the first ground plane is immediately below the first pad and the second pad.

9. The semiconductor chip according to claim 1, wherein
the signal line is above the I/O ring, and
the signal line and the second ground plane are in an identical plane of the semiconductor chip.

10. The semiconductor chip according to claim 1, wherein each of the first pad and the second pad comprises a ground-signal-ground (GSG) pad.

11. The semiconductor chip according to claim 1, wherein a distance between the first ground plane and the signal line is greater than a threshold value.

* * * * *